(12) United States Patent
Kelso et al.

(10) Patent No.: US 9,706,304 B1
(45) Date of Patent: Jul. 11, 2017

(54) SYSTEMS AND METHODS TO CONTROL AUDIO OUTPUT FOR A PARTICULAR EAR OF A USER

(71) Applicant: Lenovo (Singapore) Pte. Ltd., New Tech Park (SG)

(72) Inventors: Scott Edwards Kelso, Cary, NC (US); Russell Speight VanBlon, Raleigh, NC (US); Arnold S. Weksler, Raleigh, NC (US)

(73) Assignee: Lenovo (Singapore) Pte. Ltd., New Tech Park (SG)

( * ) Notice: Subject to any disclaimer, the term of this patent is extended or adjusted under 35 U.S.C. 154(b) by 0 days.

(21) Appl. No.: 15/084,179

(22) Filed: Mar. 29, 2016

(51) Int. Cl.
| | |
|---|---|
| H04R 3/04 | (2006.01) |
| G06F 3/16 | (2006.01) |
| H03G 3/30 | (2006.01) |
| H04R 29/00 | (2006.01) |

(52) U.S. Cl.
CPC .............. H04R 3/04 (2013.01); G06F 3/165 (2013.01); H03G 3/3005 (2013.01); H04R 29/001 (2013.01)

(58) Field of Classification Search
CPC ......... H04R 3/04; H04R 29/001; G06F 3/165; H03G 3/3005
See application file for complete search history.

(56) References Cited

U.S. PATENT DOCUMENTS

| | | | | |
|---|---|---|---|---|
| 7,957,549 B2* | 6/2011 | Chiba | ................... | H04R 1/1016 381/123 |
| 8,515,110 B2* | 8/2013 | Neumeyer | ............. | H04R 25/50 381/312 |
| 8,605,913 B2* | 12/2013 | Schwerdtner | ........ | H04R 25/552 381/23.1 |
| 8,787,602 B2* | 7/2014 | Macours | ................... | H04R 5/04 381/300 |
| 2007/0036363 A1* | 2/2007 | Hollemans | ........... | H04R 1/1041 381/59 |
| 2009/0074206 A1* | 3/2009 | Bradford | ................... | H03G 3/32 381/103 |
| 2013/0243228 A1* | 9/2013 | Muller | ................. | H04R 25/554 381/315 |

(Continued)

FOREIGN PATENT DOCUMENTS

| | | | | |
|---|---|---|---|---|
| JP | EP 0464217 A1 * | 1/1992 | ............. | H04S 1/005 |
| JP | 2012074913 A * | 4/2012 | | |
| KR | 20140044614 A * | 4/2014 | | |

OTHER PUBLICATIONS

"Headphones use ear canals to carry out ID checks", BBC News, Mar. 9, 2016, retrieved from http://www.bbc.com/news/technology-35766069.

(Continued)

*Primary Examiner* — Brenda Bernardi
(74) *Attorney, Agent, or Firm* — John L. Rogitz; John M. Rogitz

(57) ABSTRACT

In one aspect, a device includes a processor and storage accessible to the processor. The storage bears instructions executable by the processor to, based on input received from a sensor, control a first audio output per at least a first setting for a left ear of a user. The instructions are also executable by the processor to, based on input received from a sensor, control a second audio output per at least a second setting for a right ear of the user.

21 Claims, 5 Drawing Sheets

(56) References Cited

U.S. PATENT DOCUMENTS

| | | | |
|---|---|---|---|
| 2013/0279724 A1* | 10/2013 | Stafford | H04R 1/1041 381/309 |
| 2014/0016803 A1* | 1/2014 | Puskarich | H04R 1/1041 381/309 |
| 2014/0086438 A1* | 3/2014 | Tachibana | H04R 29/001 381/309 |
| 2015/0156308 A1* | 6/2015 | Jang | H04M 1/656 455/411 |
| 2015/0215719 A1* | 7/2015 | Turgul | H04R 29/00 381/58 |
| 2016/0057547 A1* | 2/2016 | Burger | H04R 25/00 381/315 |
| 2016/0205475 A1* | 7/2016 | Shanmugam | H04R 5/033 381/309 |

OTHER PUBLICATIONS

"Prototype headphones detect which ear they are in", BBC News, Mar. 8, 2012, retrieved from http://www.bbc.com/news/technology-16908936.

* cited by examiner

SYSTEMS AND METHODS TO CONTROL AUDIO OUTPUT FOR A PARTICULAR EAR OF A USER

FIELD

The present application relates generally to systems and methods to control audio output for a particular ear of a user.

BACKGROUND

As recognized herein, human ears do not all have the same hearing capabilities. This may be true even for respective ears of a single person. For instance, one ear of a person may be more sensitive to a particular volume level than the person's other ear. As also recognized herein, current phones and other devices have no satisfactory and convenient way to compensate for this difference when the person is doing something like listening to a telephone conversation using one ear and then switches the phone to the other ear during the conversation to continue listening.

SUMMARY

Accordingly, in one aspect a device includes a processor and storage accessible to the processor. The storage bears instructions executable by the processor to, based on input received from a sensor, control a first audio output per at least a first setting for a left ear of a user. The instructions are also executable by the processor to, based on input received from a sensor, control a second audio output per at least a second setting for a right ear of the user.

In another aspect, a method includes controlling, based on input received from a sensor, a first audio output per at least a first setting for a left ear of a user. The method also includes controlling, based on input received from a sensor, a second audio output per at least a second setting for a right ear of the user.

In still another aspect, a computer readable storage medium that is not a transitory signal comprises instructions executable by a processor to, based on input from a sensor, control a first audio output per at least a first setting for a left ear of a user. The instructions are also executable by the processor to, based on input from the sensor, control a second audio output per at least a second setting for a right ear of the user.

In still another aspect, a method includes determining that audio output is to be tailored to a first ear of a user. The method also includes, based on the determining that the audio output is to be tailored to the first ear of the user, controlling an audio output device to output audio per at least a first setting associated with the first ear.

The details of present principles, both as to their structure and operation, can best be understood in reference to the accompanying drawings, in which like reference numerals refer to like parts, and in which:

DETAILED DESCRIPTION

Figure 1:
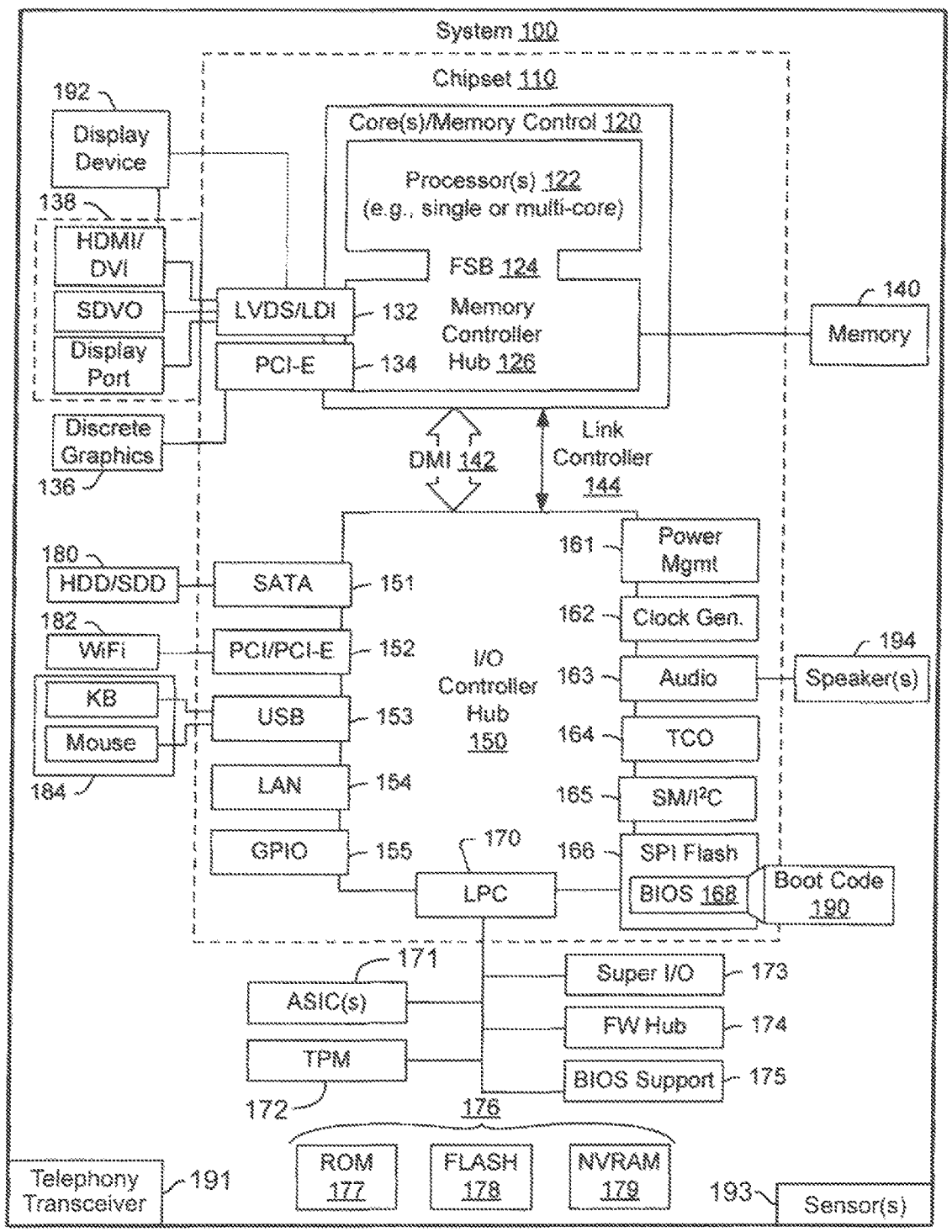
FIG. 1 is a block diagram of an example system in accordance with present principles.

With respect to any computer systems discussed herein, a system may include server and client components, connected over a network such that data may be exchanged between the client and server components. The client components may include one or more computing devices including televisions (e.g., smart TVs, Internet-enabled TVs), computers such as desktops, laptops and tablet computers, so-called convertible devices (e.g., having a tablet configuration and laptop configuration), and other mobile devices including smart phones. These client devices may employ, as non-limiting examples, operating systems from Apple, Google, or Microsoft. A Unix or similar such as Linux operating system may be used. These operating systems can execute one or more browsers such as a browser made by Microsoft or Google or Mozilla or another browser program that can access web pages and applications hosted by Internet servers over a network such as the Internet, a local intranet, or a virtual private network.

As used herein, instructions refer to computer-implemented steps for processing information in the system. Instructions can be implemented in software, firmware or hardware; hence, illustrative components, blocks, modules, circuits, and steps are sometimes set forth in terms of their functionality.

A processor may be any conventional general purpose single- or multi-chip processor that can execute logic by means of various lines such as address lines, data lines, and control lines and registers and shift registers. Moreover, any logical blocks, modules, and circuits described herein can be implemented or performed, in addition to a general purpose processor, in or by a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein. A processor can be implemented by a controller or state machine or a combination of computing devices.

Any software and/or applications described by way of flow charts and/or user interfaces herein can include various sub-routines, procedures, etc. It is to be understood that logic divulged as being executed by, e.g., a module can be redistributed to other software modules and/or combined together in a single module and/or made available in a shareable library.

Logic when implemented in software, can be written in an appropriate language such as but not limited to C# or C++, and can be stored on or transmitted through a computer-readable storage medium (e.g., that is not a transitory signal) such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc.

In an example, a processor can access information over its input lines from data storage, such as the computer readable storage medium, and/or the processor can access information wirelessly from an Internet server by activating a wireless transceiver to send and receive data. Data typically is converted from analog signals to digital by circuitry between the antenna and the registers of the processor when being received and from digital to analog when being transmitted. The processor then processes the data through its shift registers to output calculated data on output lines, for presentation of the calculated data on the device.

Components included in one embodiment can be used in other embodiments in any appropriate combination. For example, any of the various components described herein and/or depicted in the Figures may be combined, interchanged or excluded from other embodiments.

The term "circuit" or "circuitry" may be used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions.

Now specifically in reference to FIG. 1, an example block diagram of an information handling system and/or computer system 100 is shown. Note that in some embodiments the system 100 may be a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a client device, a server or other machine in accordance with present principles may include other features or only some of the features of the system 100. Also, the system 100 may be, e.g., a game console such as XBOX®, and/or the system 100 may include a wireless telephone, notebook computer, and/or other portable computerized device.

As shown in FIG. 1, the system 100 may include a so-called chipset 110. A chipset refers to a group of integrated circuits, or chips, that are designed to work together. Chipsets are usually marketed as a single product (e.g., consider chipsets marketed under the brands INTEL®, AMD®, etc.).

In the example of FIG. 1, the chipset 110 has a particular architecture, which may vary to some extent depending on brand or manufacturer. The architecture of the chipset 110 includes a core and memory control group 120 and an I/O controller hub 150 that exchange information (e.g., data, signals, commands, etc.) via, for example, a direct management interface or direct media interface (DMI) 142 or a link controller 144. In the example of FIG. 1, the DMI 142 is a chip-to-chip interface (sometimes referred to as being a link between a "northbridge" and a "southbridge").

The core and memory control group 120 include one or more processors 122 (e.g., single core or multi-core, etc.) and a memory controller hub 126 that exchange information via a front side bus (FSB) 124. As described herein, various components of the core and memory control group 120 may be integrated onto a single processor die, for example, to make a chip that supplants the conventional "northbridge" style architecture.

The memory controller hub 126 interfaces with memory 140. For example, the memory controller hub 126 may provide support for DDR SDRAM memory (e.g., DDR, DDR2, DDR3, etc.). In general, the memory 140 is a type of random-access memory (RAM). It is often referred to as "system memory."

The memory controller hub 126 can further include a low-voltage differential signaling interface (LVDS) 132. The LVDS 132 may be a so-called LVDS Display Interface (LDI) for support of a display device 192 (e.g., a CRT, a flat panel, a projector, a touch-enabled display, etc.). A block 138 includes some examples of technologies that may be supported via the LVDS interface 132 (e.g., serial digital video, HDMI/DVI, display port). The memory controller hub 126 also includes one or more PCI-express interfaces (PCI-E) 134, for example, for support of discrete graphics 136. Discrete graphics using a PCI-E interface has become an alternative approach to an accelerated graphics port (AGP). For example, the memory controller hub 126 may include a 16-lane (×16) PCI-E port for an external PCI-E-based graphics card (including, e.g., one of more GPUs). An example system may include AGP or PCI-E for support of graphics.

In examples in which it is used, the I/O hub controller 150 can include a variety of interfaces. The example of FIG. 1 includes a SATA interface 151, one or more PCI-E interfaces 152 (optionally one or more legacy PCI interfaces), one or more USB interfaces 153, a LAN interface 154 (more generally a network interface for communication over at least one network such as the Internet, a WAN, a LAN, etc. under direction of the processor(s) 122), a general purpose I/O interface (GPIO) 155, a low-pin count (LPC) interface 170, a power management interface 161, a clock generator interface 162, an audio interface 163 (e.g., for speakers 194 to output audio), a total cost of operation (TCO) interface 164, a system management bus interface (e.g., a multi-master serial computer bus interface) 165, and a serial peripheral flash memory/controller interface (SPI Flash) 166, which, in the example of FIG. 1, includes BIOS 168 and boot code 190. With respect to network connections, the I/O hub controller 150 may include integrated gigabit Ethernet controller lines multiplexed with a PCI-E interface port. Other network features may operate independent of a PCI-E interface.

The interfaces of the I/O hub controller 150 may provide for communication with various devices, networks, etc. For example, where used, the SATA interface 151 provides for reading, writing or reading and writing information on one or more drives 180 such as HDDs, SDDs or a combination thereof, but in any case the drives 180 are understood to be, e.g., tangible computer readable storage mediums that are not transitory signals. The I/O hub controller 150 may also include an advanced host controller interface (AHCI) to support one or more drives 180. The PCI-E interface 152 allows for wireless connections 182 to devices, networks, etc. The USB interface 153 provides for input devices 184 such as keyboards (KB), mice and various other devices (e.g., cameras, phones, storage, media players, etc.).

In the example of FIG. 1, the LPC interface 170 provides for use of one or more ASICs 171, a trusted platform module (TPM) 172, a super I/O 173, a firmware hub 174, BIOS support 175 as well as various types of memory 176 such as ROM 177, Flash 178, and non-volatile RAM (NVRAM) 179. With respect to the TPM 172, this module may be in the form of a chip that can be used to authenticate software and hardware devices. For example, a TPM may be capable of performing platform authentication and may be used to verify that a system seeking access is the expected system.

The system 100, upon power on, may be configured to execute boot code 190 for the BIOS 168, as stored within the SPI Flash 166, and thereafter processes data under the control of one or more operating systems and application software (e.g., stored in system memory 140). An operating system may be stored in any of a variety of locations and accessed, for example, according to instructions of the BIOS 168.

The system 100 may also include a telephony transceiver 191 accessible to the processor 122, such as a wireless cellular telephony transceiver, for communication over a telephone network such as a wireless cellular network. In addition, the system 100 may include one or more sensors 193 accessible to the processor 122 for sensing the presence and/or proximity of a user to the system 100 and, in some example embodiments, specifically the user's presence and/or proximity to an audio output device such as the speaker(s) 194, which may be used to listen to another person with whom the user may be engaged in a telephonic conversation using the system 100.

The sensor(s) 193 may be one or more of a contact sensor and/or touch sensor such as a conductive touch sensor or conductive touch display, a resistive touch sensor or resistive touch display, a capacitive touch sensor or capacitive touch display, an infrared (IR) touch sensor or IR touch display, etc. In some embodiments and in addition to sensing direct physical contact with a user, such a contact and/or touch sensor may sense a body part proximate to (e.g., hovering over or adjacent to) the sensor but not contacting it.

The sensor(s) 193 may also include a presence and/or proximity sensor such as an infrared (IR) proximity sensor, a gyroscope that senses and/or measures the orientation of the system 100 and provides input related thereto to the processor 122, and a camera that gathers one or more images and provides input related thereto to the processor 122. The camera may be a thermal imaging camera, a digital camera such as a webcam, a three-dimensional (3D) camera, and/or a camera otherwise integrated into the system 100 and controllable by the processor 122 to gather pictures/images and/or video. Other optical sensors may also establish the one or more sensors 193. In addition to or in lieu of the foregoing, the sensor(s) 193 may be established by a fingerprint sensor or another type of biometric sensor.

The sensor(s) 193 may be disposed at and around the speaker(s) 194, and/or at other portions of the system 100 that are contactable by a user. For example, the sensor(s) 193 may also be disposed along edges or sides of a housing of the system 100 that are contacted when the system 100 is embodied in a smart phone and is held to one side of a user's face to engage in a telephonic conversation.

Though not shown for clarity, in some embodiments the system 100 may include an accelerometer that senses acceleration and/or movement of the system 100 and provides input related thereto to the processor 122, as well as an audio receiver/microphone that provides input from the microphone to the processor 122 based on audio that is detected, such as via a user providing audible input to the microphone. The system may also include a GPS transceiver that is configured to receive geographic position information from at least one satellite and provide the information to the processor 122. However, it is to be understood that another suitable position receiver other than a GPS receiver may be used in accordance with present principles to determine the location of the system 100.

It is to be understood that an example client device or other machine/computer may include fewer or more features than shown on the system 100 of FIG. 1. In any case, it is to be understood at least based on the foregoing that the system 100 is configured to undertake present principles.

Figure 2:
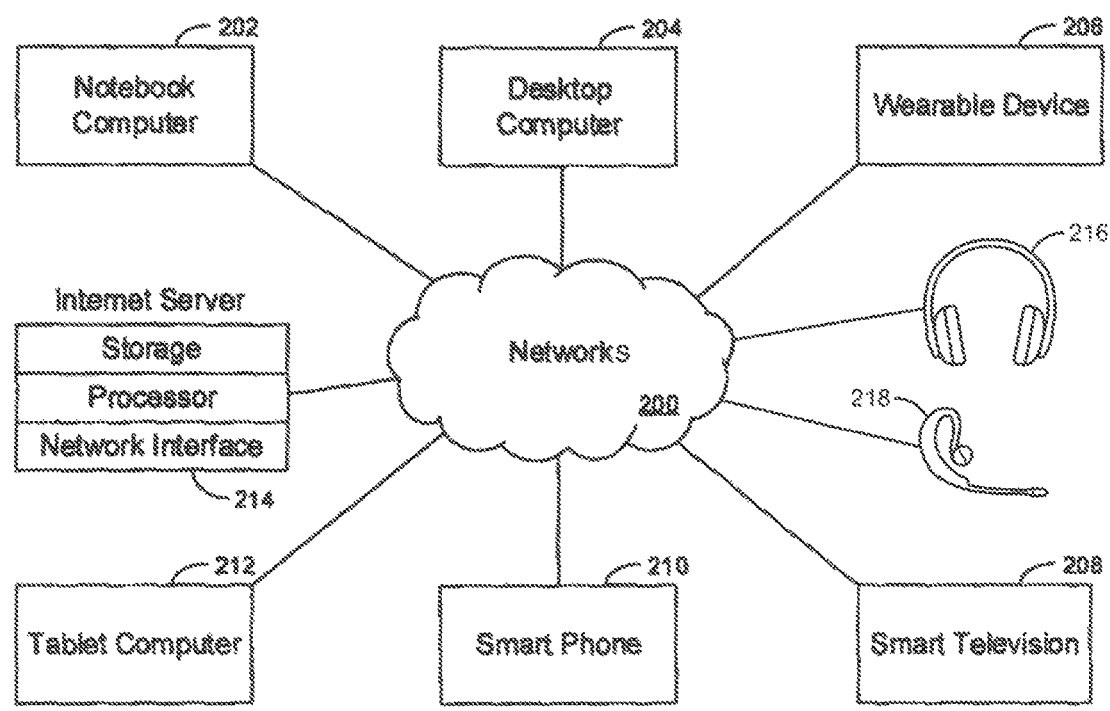
FIG. 2 is a block diagram of an example network of devices in accordance with present principles.

Turning now to FIG. 2, example devices are shown communicating over a network 200 such as the Internet, a Bluetooth network, a wireless cellular network, etc. in accordance with present principles. It is to be understood that each of the devices described in reference to FIG. 2 may include at least some of the features, components, and/or elements of the system 100 described above.

FIG. 2 shows a notebook computer and/or convertible computer 202, a desktop computer 204, a wearable device 206 such as a smart watch, a smart television (TV) 208, a smart phone 210, a tablet computer 212, Internet-enabled and computerized head phones and/or ear plugs/buds 216, a head set 218 engageable with an ear and useable for engaging in a telephonic conversation, and a server 214 such as an Internet server that may provide cloud storage accessible to the devices 202-212, 216, 218. The headphones 216 may include a different audio output device (such as different speakers) for each ear. It is to be understood that the devices 202-218 are configured to communicate with each other over the network 200 to undertake present principles.

Figure 3:
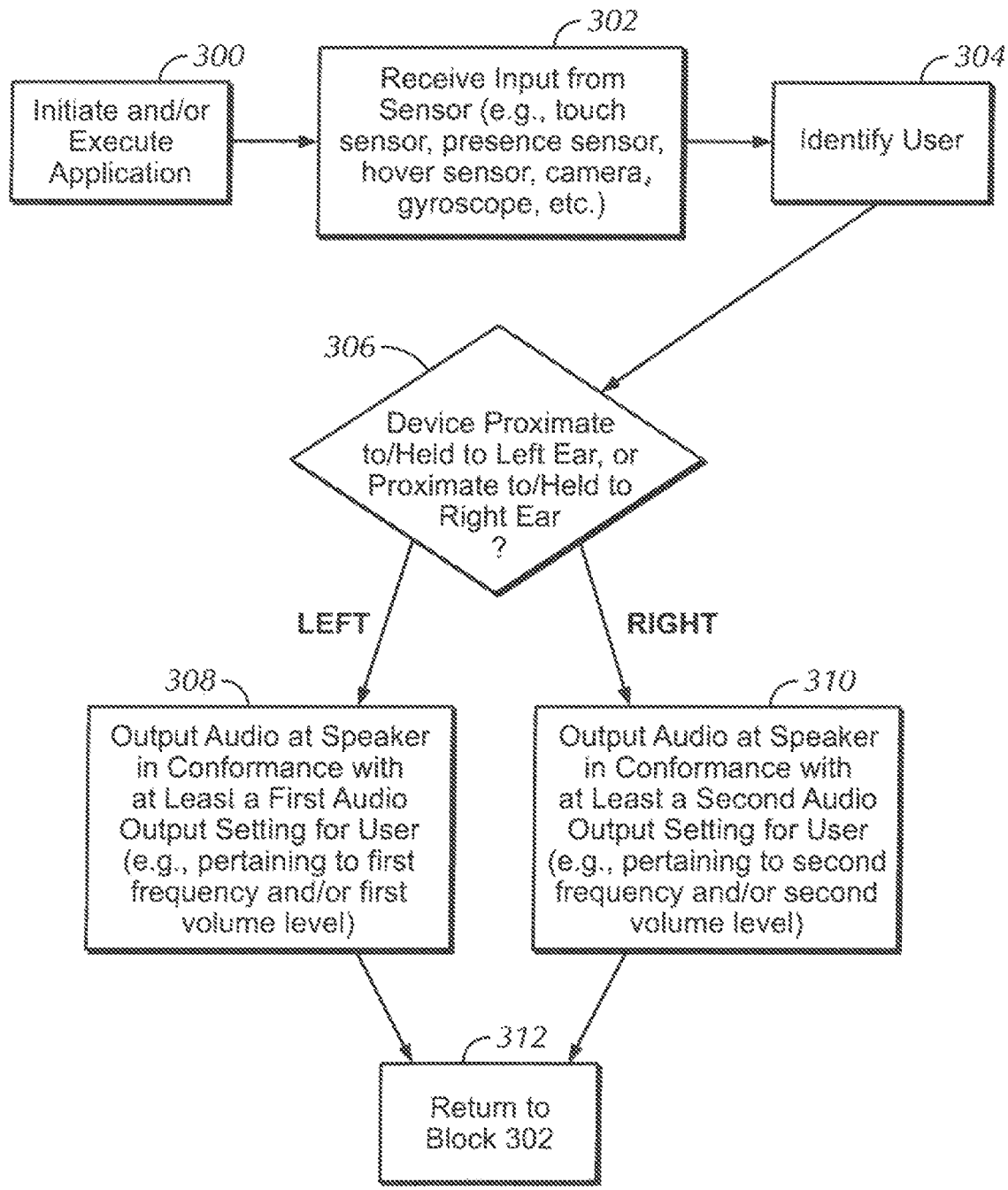
FIG. 3 is a flow chart of an example algorithm in accordance with present principles.

Referring to FIG. 3, it shows example logic that may be executed by a device such as the system 100 (referred to when describing FIG. 3 as the "present device") for determining one or more audio settings for output of audio based on a particular ear of a user that is detected in accordance with present principles. Beginning at block 300, the logic may initiate and/or execute an application for undertaking present principles, such as a touch and/or presence sensing application, a telephone application, a camera application, an audio output and control application, etc. Also at block 300, the logic may execute one or more functions, such as output of music, or initiation or facilitation of a telephone call between the present device and another device.

From block 300 the logic may proceed to block 302, where the logic may receive input from one or more sensors, such as input from the sensor(s) 193 described above. The sensor(s) may be a touch sensor, a touch-enabled display, a proximity sensor, a hover sensor, a camera, a gyroscope, a fingerprint sensor, etc. Responsive to receiving the input at block 302, the logic may move to block 304 where the logic may identify a particular user of the present device based on the input received at block 302 and/or based on other data such as the present device already being associated with a particular user, based on voice recognition, based on facial recognition, etc.

From block 304 the logic may then move to decision diamond 306. At diamond 306 the logic may determine whether the present device is proximate to and/or being held to the user's left ear, or if the present device is proximate to and/or being held to the user's right ear. For instance, the logic may determine whether the present device is being held to the user's left ear or to the user's right ear, whether the user's left ear or the user's right is in contact with the present device, whether the user's left ear or the user's right is within a threshold distance of the present device (as set by the user and/or as based on a maximum distance at which the user may be sensed), and/or whether the user's left ear or the user's right is hovering over, about, or adjacent to the present device. The determination made at diamond 306 may be based on the input from the sensor(s) received at block 302.

In some examples, respective ear profiles for the user may have already be associated with respective left and right ears of the user prior to the determination at diamond 306, and may have been established during a calibration process. For instance, during such a calibration process the user may be requested by the present device to place the present device to his or her left ear as if engaging in a telephonic conversation so that the present device can identify touch/contact points of the left ear with the present device based on input from the sensors on the present device (e.g., a touch sensor and/or a camera), as well as to identify unique shapes, contours, capacitance levels, etc. of various parts of the left ear (and/or surrounding portions of the user's face) that may also be determined based on input from the sensors. Also while the device is placed to the left ear during the calibration process, contacts points may be identified that correspond to locations of the present device at which the user is holding or gripping the present device with a hand, such as based on input from contact sensors disposed at various locations on the periphery or housing of the present device. Also while the device is placed to the left ear during the calibration process, input from a gyroscope may be used to identify a gravity vector and an orientation of the present device relative to the gravity vector while the present device is proximate to and/or placed against the left ear. This data may then be stored as a profile for the left ear during the calibration process.

Also during the calibration process, the user may be requested by the present device to place the present device to his or her right ear so that the present device can identify different touch/contact points of the right ear with the present device based on input from the sensors, as well as to identify unique shapes, contours, capacitance levels, etc. of various parts of the right ear (and/or surrounding portions of the user's face) that may also be determined based on input from the sensors. Also while the device is placed to the right ear during the calibration process, different contacts points may be identified that correspond to locations of the present device at which the user is holding or gripping the present device with a hand while placed to the right ear as opposed to the left ear, such as based on input from the contact sensors disposed at various locations on the periphery or housing of the present device. Also while the device is placed to the right ear during the calibration process, input from a gyroscope may be used to identify a gravity vector and a different orientation of the present device relative to the gravity vector while the present device is proximate to and/or placed against the right ear. This data may then be stored as a profile for the right ear during the calibration process.

These profiles for each ear, and/or the identified factors and/or unique characteristics for each ear themselves, that are identified during the calibration process may then selected during execution of the present logic based on identification of a user at block 304 associated with them. They may then be used to determine, at diamond 306 and based on the input from the sensors received at block 302, whether the present device is proximate to and/or held to the user's left ear, or whether the present device is proximate to and/or held to the user's right ear. For instance, the left ear and right ear profiles may be compared to the current sensor data received at block 302 and a match or nearest match of at least some data in one of the profiles to the current sensor data may be used to make the determination at diamond 306.

If the current sensor data matches data in both profiles, one of the profiles and hence a particular ear may be determined as a match based on the current sensor data matching (or more nearly matching) more data in one of the left ear and right ear profiles than the other of the left ear and right ear profiles. A weighting or prioritization of data types may also be used so that if current sensor data matches or more nearly matches data for a higher-weighted data type in one of the profiles, the ear associated with that profile may be determined as a match at diamond 306 even if data for a lower-weighted data type matches data for the other ear's profile. As an example of weighted characteristics, unique ear characteristics may be weighted higher than device orientation. An administrator or manufacturer of the present device, and/or the user, may specify such a weighting.

Responsive to a determination at diamond 306 that the present device is proximate and/or being held to the user's left ear, the logic may move to block 308. At block 308 the logic may output audio, such as music or audio of a telephone conversation being facilitated by the present device, in conformance with at least one audio output setting for the left ear of the user as may have been accessed from storage at the present device or another location accessible to the present device. In some embodiments, the audio output setting(s) for the left ear may even be stored as part of the profile for the left ear. The audio output setting(s) for the left ear may include equalization (EQ) frequency settings related to output of audio at various frequencies/frequency bands for the left ear, and/or an overall volume output level for audio output for the left ear as may have been specified by the user at a previous time. From block 308 the logic may proceed to block 312, at which the logic may revert back to block 302 and proceed therefrom so that, for example, a subsequent change in the user holding the present device to his or her right ear may be identified and audio output subsequently adjusted accordingly.

Responsive to a determination at diamond 306 that the present device is proximate and/or being held to the user's right ear, the logic may instead move to block 310. At block 310 the logic may output audio in conformance with at least one audio output setting for the right ear of the user as may have been accessed from storage at the present device or another location accessible to the present device. In some embodiments, the audio output setting(s) for the right ear may even be stored as part of the profile for the right ear. The audio output setting(s) for the right ear may include different EQ frequency settings related to output of audio at various frequencies/frequency bands for the right ear than for the left ear, and/or a different overall volume output level for audio output for the right ear, though in some instances some of these settings may pertain to the same volume output level and/or output levels for various frequencies/frequency bands as for the left ear. From block 310 the logic may proceed to block 312, at which the logic may revert back to block 302 and proceed therefrom so that, for example, a subsequent change in the user holding the present device to his or her left ear may be identified and audio output subsequently adjusted accordingly.

Figure 4:
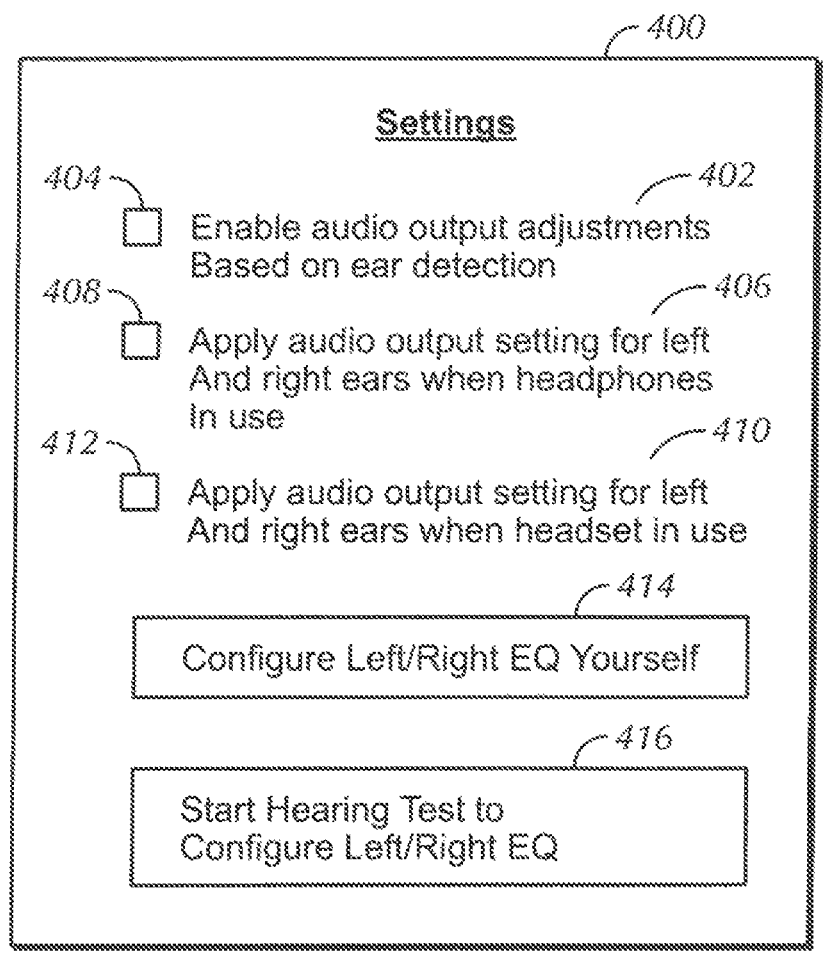
FIGS. 4 and 5 are example user interfaces (UI) in accordance with present principles.

Before moving on to the description of FIG. 4, it is to be understood that in some embodiments, rather than an (e.g., single) audio output device on the present device itself being controlled per various settings as disclosed above, one or more speakers on another device may be controlled. For instance, the user may be wearing a headset or headphones. The logic of FIG. 3 may be executed by a smart phone in communication a headset or headphones, and/or by the headset or headphones themselves. Furthermore, sensors for sensing ear characteristics, contact points, etc. may be on either or both of the headset/headphones (e.g., touch sensors at respective ear pieces for the left and right ears of the headphones) and the smart phone (such as if the sensor is a camera on the smart phone) when executing the logic described herein. It is to be further understood that in an embodiment where plural audio output devices—one for the left ear and one for the right ear—may be used to present audio, such as may be the case when a user is using headphones, those audio output devices may be controlled simultaneously but independently to output audio at different respective levels per one or more respective audio output settings for each respective ear.

Now describing FIG. 4, it shows an example user interface (UI) 400 that may be presented on a display of a device undertaking present principles, such as a display of a device executing the logic of FIG. 3. The UI 400 may be manipulated by a user to configure one or more settings of the device in accordance with present principles.

As may be appreciated from FIG. 4, the UI 400 may include a first setting 402 (enableable using check box selector 404) to enable audio output adjustments based on a particular ear that is detected as disclosed herein. The UI 400 may include a second setting 406 (enableable using check box selector 408) to enable use of respective audio output settings for left and right ears for outputting audio when head phones are being used, as well as a third setting 410 (enableable using check box selector 412) to enable use of audio output settings for one of a left or right ear for outputting audio when a headset is used and identified as in contact with one of the left and right ear, respectively.

The UI 400 may also include a selector 414 that is selectable for another UI to be presented at which a user may configure overall volume levels and/or frequency settings for each ear, such as the UI 500 described below. The UI 400 may further include a selector 416 that is selectable to initiate a hearing test using a speaker on the device so that the device may automatically determine overall volume levels and frequency settings for each of the user's ear that are to be applied in accordance with present principles.

For instance, selection of selector 416 may initiate a hearing test where a user may be audibly prompted to place a speaker of the device proximate to or at one of the user's ears. The device may then output audio at various overall volume levels, and/or increase or decrease output levels for certain frequency bands, and prompt the user to respond (e.g., audibly, as detected using voice recognition) at various stages regarding whether the user can hear the audio and if the audio is at an acceptable level for the user. Once the user provides input that overall volume and/or an output level at a certain frequency band is at a desirable level, a profile and/or settings for that overall volume and/or various frequency output levels may be generated, associated with the particular ear to which the speaker is being held, and stored for later use in accordance with present principles. The process may then be repeated for the other ear of the user.

Figure 5:
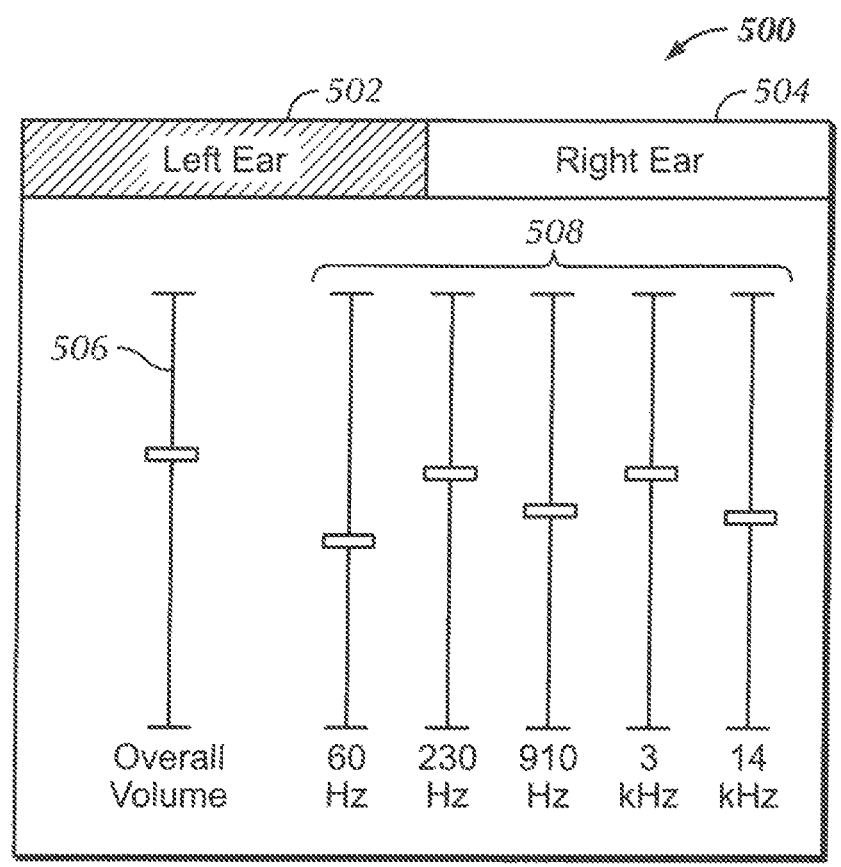

FIG. 5 shows the UI 500 mentioned above. The UI 500 may be manipulable by a user to configure overall volume levels settings and/or particular frequency band level settings for each of the user's ears. Tabs 502, 504 are respectively associated with settings for a left ear and a right ear of a user. The tabs 502, 504 may be toggled between based on selection of each one to adjust an overall volume level setting 506 for the ear associated with the selected tab and to adjust various frequency band level settings 508 for the ear associated with the selected tab. The shading shown on tab 502 indicates that tab 502 is a currently-selected tab in this example, and hence sliders shown along the vertical bars for each of the settings 506, 508 establish, respectively, an overall volume level amount and frequency band level amounts to be applied for audio output when the user's left ear is detected as being proximate to an audio output device as disclosed herein.

It is to be understood that in addition to adjusting overall volume level and levels of various frequency bands, still other types of audio adjustments may be made. For instance, compression or other audio processing may be used to make soft sounds louder by a certain degree, and/or louder sounds softer by a certain degree, based on which car of a user is proximate to an audio output device that is being controlled. In this way, audio output may seem "flat" and/or different frequencies may seem as if all are presented at a same volume level to a user despite the hearing capabilities of one of the user's ears or the other.

It is to also be understood that still other ways of identifying a particular ear of a user, and/or whether a speaker is proximate to a left ear or a right ear, may be used in accordance with present principles. For embodiments where headphones having ear cups are to be used to output audio, the following example methods may be used. As a first example, when headphones with ear cups are put onto a person's head, the angle of the ears against the head will cause the ear cups to converge toward the front of the face. This angle can be identified (e.g., using input from one or more gyroscopes on the headphones) and then used to determine which speaker of the headphones is proximate to the user's left ear and which is proximate to the user's right ear by comparing the measured angles to prestored data for angles associated with each ear.

As another headphones with ear cups example, touch and/or pressure sensors may be disposed around or along the perimeter of portions of the ear cups that will contact the person when worn. The contact pattern may be identified from the sensor input and, by comparing the pattern to prestored data associated with each ear, can be used to determine which speaker of the headphones is proximate to the user's left ear and which is proximate to the user's right ear.

As another headphones with ear cups example, a tilt angle sensed by a gyroscope and/or accelerometer as a user places the headphones on his or her head may be identified and compared against prestored data for tilt angles to determine which speaker of the headphones is being placed proximate to the user's left ear and which is being placed proximate to the user's right ear based on which angle matches prestored data for a first left ear/right ear orientation or a second left ear/right ear orientation in which the speaker-to-ear orientation is reversed. Touch sensors and/or fingerprint sensors may also be used in this example to determine which of a left hand or a right hand is being used to place a respective speaker of the headphones proximate, respectively, to the left ear or the right ear, with the device assuming a right hand would be used to place a speaker proximate to a right ear, and assuming a left hand would be used to place a speaker proximate to a left ear.

As yet another headphones with ear cups example, a set of headphones may have a microphone with a microphone boom attached to the headphones. The side of the microphone may be used to determine which speaker of the headphones is proximate to the user's left ear and which is proximate to the user's right ear (e.g., based on which side is experiencing audio interference).

For embodiments where headphones having ear plugs/buds are used to output audio, the following example methods may be used. As a first example, input from an accelerometer and/or gyroscope may be used to determine the direction of "down" relative to the user (as determined from a gravity vector identified using the gyroscope). The direction of "down" and the tilt angle for a respective ear plug may be used to determine which speaker of the headphones is proximate to the user's left ear and which is proximate to the user's right ear based on known angles for the ear plugs for respective placement in each ear.

As another example using ear plugs, data from a wearable device such as a smart watch that senses its orientation on either the left or right wrist of a user may be provided to a device undertaking present principles (such as the headphones themselves) and then used by the head phones to triangulate which hand (the one with the wearable, or the other hand) is closer to which ear when contacting a respective ear plug with the respective ear to determine which speaker of the headphones is proximate to the user's left ear and which is proximate to the user's right ear based on an assumption that a left hand would be used to place one ear plug to the left ear and an assumption that a right hand would be used to place the other ear plug to the right ear.

As another example for head phones with ear plugs, a device undertaking present principles can make an assumption, such as based on user input or usage history data, that a certain user inserts one earplug into one of the left ear or right ear first before placing the other ear plug into the other respective ear. This assumption and identification of a first speaker as being placed proximate to one ear of a user before the other speaker is placed proximate to the other ear can be used to determine which speaker of the headphones is proximate to the user's left ear and which is proximate to the user's right ear.

As another example using ear plugs, it is to be understood that some people have different physical characteristics for each ear. After an ear plug has been placed into one ear of the user, unique characteristics of the particular ear (e.g., the shape and size of that ear's ear canal) can be identified (e.g., based on input from an IR proximity sensor or another type of optical sensor on the ear plugs, as well as based on input from an acoustic sensor that pings the dimensions of an ear canal) and compared to prestored data associating certain unique characteristics with one of the left ear or right ear of the user. The identification of the unique characteristics and a determination of which ear the unique characteristics are associated with can be used to determine which speaker of the headphones is proximate to the user's left ear and which is proximate to the user's right ear.

As yet another example using ear plugs but where they may be stabilized using respective hooks that wrap around the backs of the user's ears, an orientation of each ear hook may be identified when engaged with the person's head (e.g., based on input from contact sensors, a gyroscope, etc.) to determine a speaker that is coupled proximate to the hook as being proximate to the user's left ear or user's right ear.

As yet another example for headphones that is applicable to embodiments where either of ear buds or ear cups are used, input from a small camera or other optical imager (and/or input from an acoustic sensor) on the headphones (e.g., on the ear buds or car cups themselves) may be used to capture an image of the ear (characteristics for inside the ear and/or outside characteristics) as the headphones are being put on. The input may then be analyzed and compared to prestored data for unique characteristics that is associated with one of the left ear or right ear of the user. The identification of the unique characteristics and a determination of which ear the unique characteristics are associated with can be used to determine which speaker of the headphones is proximate to the user's left ear and which is proximate to the user's right ear.

Before concluding, it is to be understood that although a software application for undertaking present principles may be vended with a device such as the system 100, present principles apply in instances where such an application is downloaded from a server to a device over a network such as the Internet. Furthermore, present principles apply in instances where such an application is included on a computer readable storage medium that is being vended and/or provided, where the computer readable storage medium is not a transitory signal and/or a signal per se.

It is to be understood that whilst present principals have been described with reference to some example embodiments, these are not intended to be limiting, and that various alternative arrangements may be used to implement the subject matter claimed herein.

What is claimed is:

1. A device, comprising:
   a processor;
   storage accessible to the processor and bearing instructions executable by the processor to:
   based on input received from at least one sensor, control a first audio output per at least a first setting for a left ear of a user;
   based on input received from at least one sensor, control a second audio output per at least a second setting for a right ear of the user; and
   present a user interface (UI) on a display at which control is enableable of audio output based on audio output settings for the left ear and the right ear.

2. The device of claim 1, wherein the instructions to control comprise instructions executable by the processor to:
   based on input received from a first sensor, control the first audio output per at least the first setting for the left ear of the user; and
   based on input received from a second sensor, control the second audio output per at least the second setting for the right ear of the user.

3. The device of claim 1, comprising at least one audio output device for outputting the first audio output and the second audio output.

4. The device of claim 1, comprising the at least one sensor.

5. The device of claim 4, comprising a telephony transceiver, and wherein the first audio output and the second audio output pertain to a telephone call facilitated at least in part using the telephony transceiver.

6. The device of claim 1, wherein the first setting is different from the second setting but is of a same setting type as the second setting.

7. The device of claim 1, wherein at least one sensor from which input is received comprises one or more of: a touch sensor, a camera.

8. The device of claim 1, wherein at least one audio output device is used for outputting the first audio output and the second audio output, and wherein the first setting pertains to at least one frequency band of audio output from the at least one audio output device.

9. The device of claim 1, wherein at least one audio output device is used for outputting the first audio output and the second audio output, and wherein the first setting pertains to overall volume used to output audio from the at least one audio output device.

10. The device of claim 1, wherein the instructions are executable by the processor to:
    based on input received from at least one sensor, identify a first characteristic of a canal of the left ear and control the first audio output per at least the first setting for the left ear based on the identification of the first characteristic; and
    based on input received from at least one sensor, identify a second characteristic of a canal of the right ear and control the second audio output per at least the second setting for the right ear.

11. The device of claim 1, wherein the instructions are executable by the processor to:
    present a user interface (UI) on a display at which the first setting and the second setting are configurable, the UI at which the first setting and the second setting are configurable comprising at least one selector to toggle between configuration of the first setting and configuration of the second setting.

12. The device of claim 1, wherein the instructions are to control comprise instructions executable by the processor to:
based on input received from a first sensor, control the first audio output per at least the first setting for the left ear of the user; and
based on input received from the first sensor, control the second audio output per at least the second setting for the right ear of the user.

13. The method of claim 12, wherein the first setting pertains to outputting at least some audio louder than had audio output not been controlled per the first setting.

14. The device of claim 1, wherein the instructions are executable by the processor to:
based on input received from at least one gyroscope, control the first audio output per at least the first setting for the left ear of the user;
based on input received from at least one gyroscope, control the second audio output per at least the second setting for the right ear of the user.

15. A method, comprising:
controlling, based on input received from at least one sensor, a first audio output per at least a first setting for a left ear of a user;
controlling, based on input received from at least one sensor, a second audio output per at least a second setting for a right ear of the user; and
presenting a user interface (UI) on a display, the UI comprising a setting that is enableable for a device to control audio output per at least the first setting for the left ear and per at least the second setting for the right ear.

16. The method of claim 15, comprising:
controlling at least one speaker accessible to the device to output the first audio and the second audio.

17. The method of claim 15, comprising:
controlling, based on input received from at least one orientation sensor, the first audio output per at least the first setting for the left ear of the user; and controlling, based on input received from at least one orientation sensor, the second audio output per at least the second setting for the right ear of the user.

18. A computer readable storage medium that is not a transitory signal, the computer readable storage medium comprising instructions executable by a processor to:
based on input from a sensor, control a first audio output per at least a first setting for a left ear of a user;
based on input from the sensor, control a second audio output per at least a second setting for a right ear of the user; and
present a user interface (UI) on a display accessible to the processor, the UI comprising a setting that is enableable for the processor to control audio output per at least the first setting for the left ear and per at least the second setting for the right ear.

19. The computer readable storage medium of claim 18, wherein the first audio output and the second audio output are output through a same audio output device.

20. The computer readable storage medium of claim 18, wherein the instructions are executable by the processor to:
control a first output device to output the first audio output and simultaneously control a second audio output device different from the first audio output device to output the second audio output.

21. A method, comprising:
determining that audio output is to be tailored to a first ear of a user;
based on the determining that the audio output is to be tailored to the first ear of the user, controlling an audio output device to output audio per at least a first setting associated with the first ear; and
presenting a user interface (UI) on a display, the UI comprising a selector that is enableable for an apparatus to control audio output, using the audio output device, per at least the first setting associated with the first ear.

* * * * *